PRINTED CIRCUIT BOARD TERMINAL AND CONNECTOR

Filed July 24, 1967

3 Sheets-Sheet 1

Inventor
Wallace Hansen
By: Olson, Trexler, Wolters & Bushnell attys

Inventor
Wallace Hansen
By: Olson, Trexler, Wolters & Bushnell attys.

Inventor
Wallace Hansen
By: Olson, Trexler, Wolters & Bushnell Attys.

United States Patent Office 3,493,916

Patented Feb. 3, 1970

3,493,916

PRINTED CIRCUIT BOARD TERMINAL AND CONNECTOR

Wallace Hansen, Glen Ellyn, Ill., assignor to Molex Products Company, Downers Grove, Ill., a corporation of Illinois Filed July 24, 1967, Ser. No. 655,504

Int. Cl. H05k *1/00*

U.S. Cl. 339—17 13 Claims

ABSTRACT OF THE DISCLOSURE

This invention relates to a connector assembly for electrically connecting a plurality of leads or wires to a printed circuit. More particularly, this invention relates to a plug and receptacle assembly which is mounted on a printed circuit board to interconnect electrical circuitry.

When printed circuits are to be connected by wires or leads to other circuitry, the wires or leads are usually connected directly to the printed circuit. If the printed circuit is to be readily connected to and disconnected from the associated circuitry, a connector assembly is provided in the circuit between the printed circuit and the associated circuitry. The connector assembly must be connected to both the leads associated with the circuitry and the leads connected to the printed circuit. This interconnection of the printed circuit and the connector assembly increases both production time and expense.

Therefore, it is a general object of this invention to provide a printed circuit board terminal and connector assembly which overcomes the aforementioned limitations of prior art constructions. Specifically, it is an object of this invention to provide a connector assembly which is mounted directly on a printed circuit board for connecting the printed circuit to associated circuitry.

These and other objects and features of the invention will become more apparent upon a reading of the following detailed description taken in connection with the accompanying drawings, wherein.

Figures 1, 2:
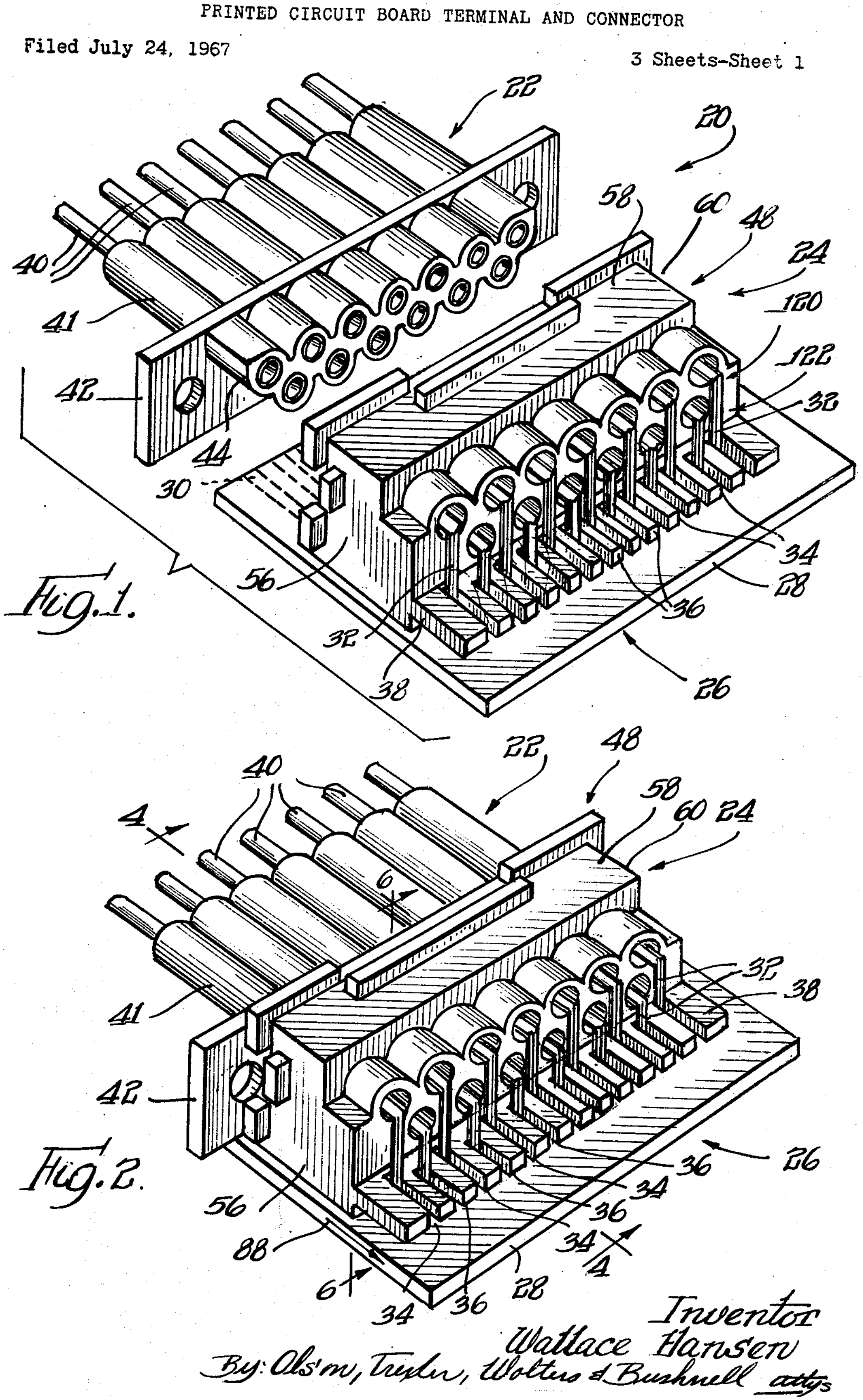
FIG. 1 is a perspective view of a connector assembly forming a preferred embodiment of the invention illustrating a receptacle of the connector assembly in a spaced apart relationship with a plug which is mounted on a printed circuit board.
FIG. 2 is a perspective view, similar to FIG. 1, illustrating the connector assembly of FIG. 1 with the receptacle inserted in a socket formed by the plug and the printed circuit board.

Referring now to the drawings in greater detail, a connector assembly 20 in illustrated in FIG. 1. The connector assembly 20 includes a receptacle 22 adapted to be inserted into mating engagement with a plug 24, as shown in FIG. 2, which is mounted on a printed circuit 26. The printed circuit 26 includes a printed circuit board 28 having well known printed circuitry 30 mounted thereon. The plug 24 includes a plurality of terminals 32 which have a rearward end portion extending through either a first series of relatively long slots 34 or a second series of relatively short slots 36 in a rearwardly extending flange portion or section 38 of the plug 24. The terminals 32 also include a forwardly extending portion, see FIG. 4, which engages terminals in the receptacle 22. The terminals in the receptacle 22 are connected to a plurality of wires or leads 40 which interconnect the printed circuit 26 with other electrical circuitry, not shown.

The receptacle 22 is molded of a suitable insulating material such as nylon or any of the other commercially available polymeric materials. The receptable includes a rearwardly projecting base section 41 which is integrally formed with a flange or cover section 42. A forwardly projecting end portion 44 is also integrally formed with the flange section 42. The forward end portion 44 is inserted into a socket formed in the plug 24, as shown in FIG. 2, to interconnect terminals in the receptacle 22 and the plug 24.

Figures 3, 4, 5:
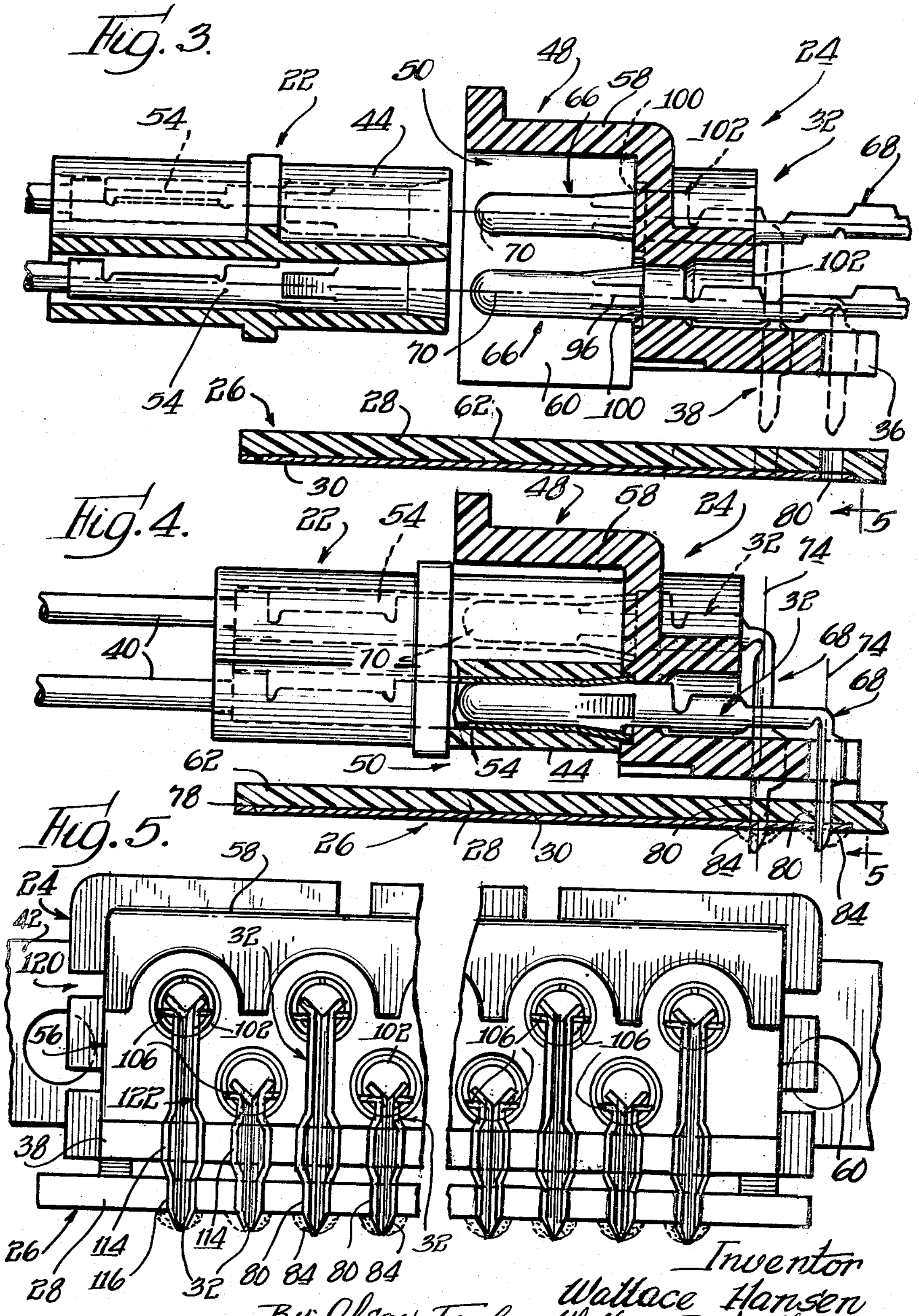
FIG. 3 is an enlarged sectional view illustrating the receptacle in a spaced apart relationship relative to the plug, similar to FIG. 1, with rearward end portions of terminals of the plug being illustrated in solid lines in an initial position and in a bent or normal position in dashed lines for engagement with the circuit board which is shown spaced apart from the plug.
FIG. 4 is an enlarged sectional view, taken along the line 4—4 of FIG. 2, with the terminals of the plug being shown in engagement with the printed circuit board and printed circuitry mounted on the printed circuit board.
FIG. 5 is an enlarged elevational view, taken along the line 5—5 of FIG. 4, further illustrating the interrelationship between the terminals of the plug and the printed circuit board.

The plug 24 is also made of a suitable insulating material, such as nylon or one of the other commercially available polymeric materials and includes a socket section 48. The socket section 48 cooperates with the printed circuit board 28 to define a socket or cavity 50 (see FIG. 3) into which the forward end portion 44 of the receptacle 22 is inserted (as shown in FIG. 4) to move metallic female type terminals 54 into mating telescopic engagement with metallic male type terminals 32 of the plug 24. The socket 50 is defined by a plurality of forwardly extending walls 56, 58, and 60 of the plug 24 and an upper surface 62 of the circuit board 28 (see FIGS. 2 and 4). The socket section 48 of the plug 24 guides the forward end portion 44 of the receptacle 22 to interengage the terminals 32 and 54.

Referring now to FIG. 3, the terminals 32 include a forwardly extending generally cylindrical end portion 66 which is integrally formed with a rearwardly extending end portion 68. The rearwardly extending end portion 68 initially extends in a coaxial relationship with a horizontally extending longitudinal axis 70 of the forward end portion 66. The terminals 54 are advantageously formed for resilient engagement with the end portion 66 of the terminals 32 as disclosed in United States Patent No. 3,178,673. The rearwardly extending end portion 68 of each terminal 32 is bent from the initial position shown in solid lines in FIG. 3 to a normal or operational position shown in dashed lines in FIG. 3 and solid lines in FIG. 4. When the end portions 68 of the terminals 32 are in the normal position, the terminals are bent so that the longitudinal axis 70 of each of the forward end portions 66 of the terminals 32 is perpendicular to the longitudinal axis 74 of each of the bent downwardly extending end portions 68 of the terminals 32. It should be noted that the axes 74 for the terminals 32 extend in a generally perpendicular relationship with the upper surface 62 of the circuit board 28 and a lower surface 78 of the circuit board on which the printed circuitry 30 is mounted. The longitudinal axes 70 of the forward end portions 66 of the terminals 32 extend centrally of the female type terminals 54 in the receptacle 44 so that the female type terminals 54 engage the end portions 66 of the male type terminals 32 in a generally coaxial relationship. The rearward end portions of the terminals 32 extend through apertures 80 in the printed circuit board 28, see FIG. 4, securely to connect the terminals and the plug 24 to the printed circuit board 28. The rearwardmost or outermost end portions of the terminals 32 are soldered, as indicated at 84 in FIGS. 4 and 5, to interconnect the terminals and the printed circuitry 30. Thus, the printed circuitry 30 is connected to the wires 40 and the associated electrical circuitry by the terminals 32 of the plug 24 and the terminals 54 of the receptacle 22.

When the receptacle 22 is moved from a disengaged position with the plug 24, as shown in FIG. 1, to an engaged position with the plug 24, as shown in FIG. 2, the receptacle 22 is pressed toward the plug 24 to push the forward end portion 44 of the receptacle into the cavity 50 in the socket section 48 of the plug. As the forward end portion 44 of the receptacle is pushed into the socket section 48 of the plug 24 the forward end portions 66 of the terminals 32 are moved into telescopic mating engagement with the terminals 54. The force exerted to move the receptacle 22 into engagement with the plug 24 results in a reaction force between the printed circuit 26 and the receptacle element 24. This reaction force is transmitted by the rearward end portions 68 of the terminals 32 to the circuit board 28. Since the receptacle 22 is moved longitudinally relative to the circuit board 28 from the position shown in FIG. 1 to the position shown in FIG. 2, the reactive force against the circuit board is exerted longitudinally on the circuit board as indicated by an arrow 88 in FIG. 2. This reactive force is exerted longitudinally against the circuit board 28, and the circuit board does not tend to bend and deform the printed circuitry 30. If the plug 24 were mounted in an upright relationship rather than a longitudinal relationship, that is rotated 90 degrees from the position shown in FIG. 1, the reactive force would be exerted transversely of the circuit board 28 and would tend to bend the circuit board about its relatively weak transverse axis. Of course, when the circuit board 28 is bent or deformed under loading, the delicate printed circuitry 30 tends to crack, and shorts and other malfunctions soon develop in the printed circuitry. However, with the longitudinal loading, in the direction of the arrow 88 in FIG. 2, the insertion of the receptacle 22 into the plug 24 does not bend or deflect the circuit board 28. This absence of bending or deformation enables the receptacle 22 to be inserted repeatedly into the plug 24 of applicant's connector assembly without cracking or otherwise damaging the printed circuitry 30.

Figures 6, 7, 8, 9, 10, 11:
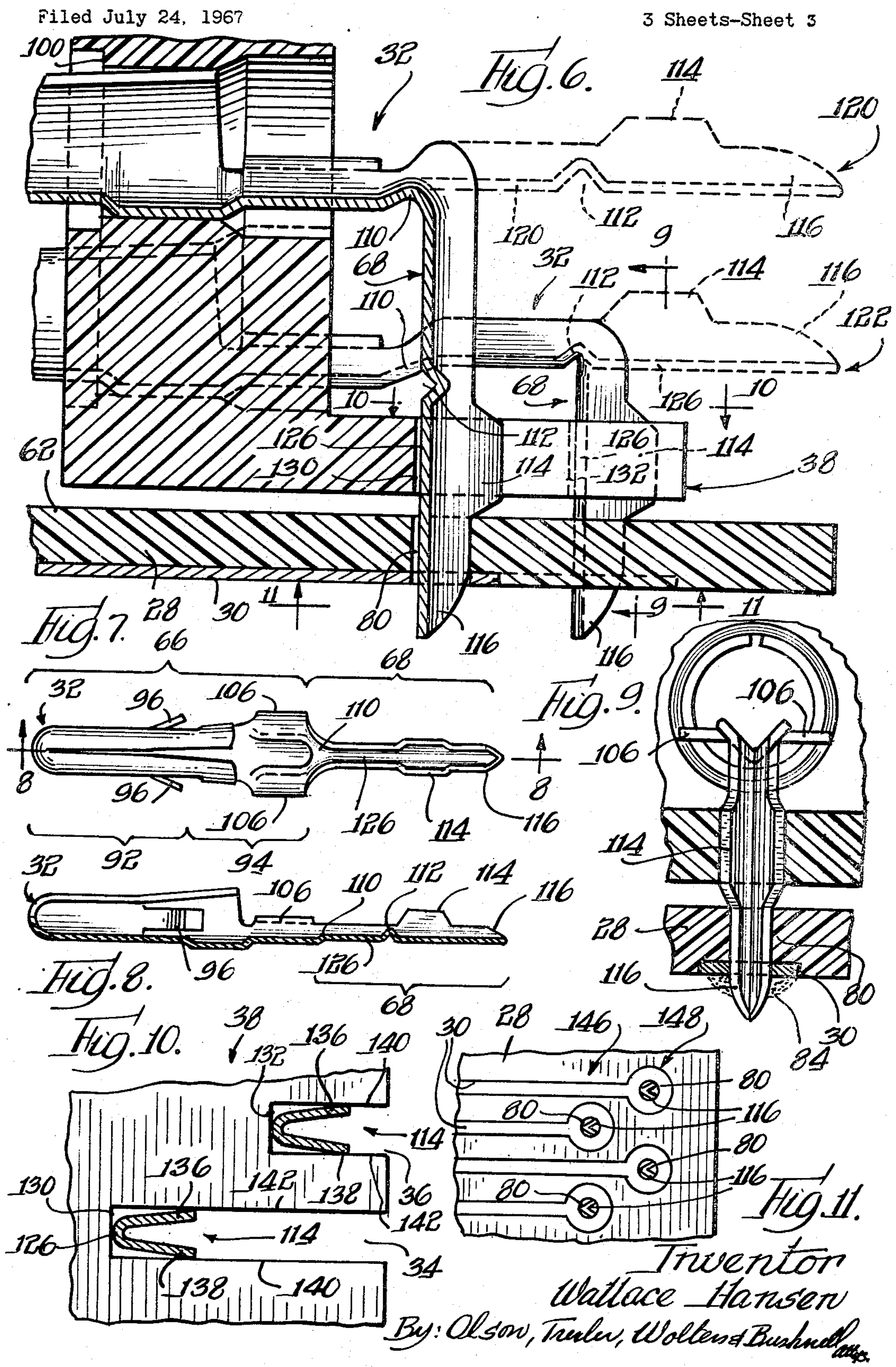
FIG. 6 is a greatly enlarged sectional view, similar to FIG. 4, illustrating the relationship between the terminals of the plug and the printed circuit board, the terminals being shown in dashed lines in the initial rearwardly extending position and in solid lines in the bent or normal position.
FIG. 7 is an enlarged plan view of a terminal of the plug.
FIG. 8 is an enlarged sectional view, taken along the line 8—8 of FIG. 7, further illustrating the structure of the terminal.
FIG. 9 is an enlarged sectional view taken along the line 9—9 of FIG. 6 illustrating the relationship between the terminal of the plug and the printed circuit board.
FIG. 10 is a greatly enlarged sectional view, taken along the line 10—10 of FIG. 6, illustrating the interrelationship between the terminals and the plug.
FIG. 11 is an enlarged plan view, taken along the line 11—11 of FIG. 6, illustrating the relationship between an outer end portion of the terminals of the plug and the circuit board.

The terminals 32 are shown in greater detail in FIGS. 6 through 8. The forward end portions 66 of each of the terminals 32 include a terminal connector section or end portion 92 and a mounting or central portion 94. The connector end portion and central or mounting portions 92 and 94 are formed substantially similar to the male type terminals disclosed in the aforementioned Patent No. 3,178,673 and have resilient fingers 96 for engaging a radially inwardly extending surface 100 (see FIG. 3) of bores or apertures 102 in the receptacle 24. A plurality of wings or shoulder sections 105 are provided in the mounting section 94 for engagement with an opposite radially inwardly projecting surface of the plug 24. The rearward end portion 68 includes a first forward or innermost shoulder or offset 110 and a second offset or notch 112 which is positioned rearwardly or outwardly of the offset 110. A slot engaging wedge section or flange 114 is positioned adjacent to and outwardly from the recess 112. An outermost tip or end portion 116 is located adjacent to the wedge shaped slot engaging section 114 for engagement with the apertures 80 in the circuit board 28.

The terminals 32 are mounted in the plug 24 in a plurality of paralel rows 120 and 122, as is best seen in FIG. 5. The rearward end portion 68 of the terminals 32 in the upper row 120 are bent or deformed at the offset 110 downwardly from the initial position shown in dashed lines in FIG. 6 to the normal position shown in solid lines in FIG. 6. When the rearward end portion 68 of the terminal 32 is bent at the offset 110 the wedge shaped section 114 engages the relatively long slots 34 in the flange section 38 of the plug 24. The rearward end portions 68 of the lower or inner row 122 of terminals 32 are bent at the offset 112 downwardly from the position shown in dashed lines in FIG. 6 to the position shown in solid lines. When the rearward end portions 68 of the terminals in the inner row 122 have been bent to the normal position, the wedge shaped flange sections 114 engage the relatively shorter slots 36 in the flange section 38. From a consideration of FIG. 6 it is apparent that the offsets 110 and 112 are spaced apart for substantially the same distance as are longitudinally extending base or apex portions 126 of the rows of terminals 120 and 122. Thus, the wedge shaped sections 114 of the identical terminals of the upper row 120 engage the flange section 38 of the plug 24 when the rearward end portion 68 of the terminal is bent at the offset 110. Similarly, the wedge shaped section 114 of the lower row of terminals 122 engages the flange section 38 when the lower row of terminals are bent at the offset 112. The end portions 116 of both rows of terminals 120 and 122 project for substantially the same distance downwardly from the receptacle 24 to engage apertures 80 in the printed circuit board 28. Since the end portions 116 project downwardly and through the printed circuit board 28 for the same distance they can be readily soldered to the printed circuitry 30 on the underside of the circuit board 28.

The wedge shaped sections 114 of the upper row of terminals 120 are positioned with the base or apex 126 adjacent to an end wall 130 (see FIGS. 6 and 10) of the relatively long slots 34. Thus, when the receptacle 22 is inserted into the plug 24 the end wall 130 is pressed into engagement with the base section or apex 126 of the rearward end portion 68 of the terminals in the upper row 120. Similarly, the apex or base portion 126 of the lower row of terminals 122 are positioned adjacent to an end wall 132 of the slots 36, so that the end wall 132 is pressed against the base wall 126 when the receptacle 22 is inserted into the plug 24. The rearward end portions 68 of the terminals 32 are bent downwardly to form substantially right angle corners at the offsets 110 and 112 so that the end walls 130 and 132 of the slots 34 and 36 press the circuit board engaging tip or end portion 116 of the terminals rearwardly, as indicated by the arrow 88 in FIG. 2, to load the circuit board about its relatively strong transversely extending side rather than the relatively weak, at least in bending, longitudinally extending surface or side 62. Thus, due to the right angled relationship between the circuit board engaging end portions 116 of the terminals 32 and the forward sections 66 of the terminals 32, the reactive force resulting from inserting the receptacle 22 into the plug 24 is applied against the relatively strong transverse or side axis of the circuit board 28 so that the printed circuitry 30 is not deflected and cracked or broken.

Referring now to FIGS. 9 and 10, the slot engaging sections 114 of the terminals 32 have a generally V-shaped cross section, as does the entire rearward end portion 68 of the terminal. The wedge shaped flange engaging sections 114 of the terminals include a pair of opposite legs 136 and 138 which engage opposite longitudinally extending side walls 140 and 142 of the slots 34 and 36 to retain the rearward end portions 68 of the terminals in the positions shown in FIG. 6. The tip or outermost end portion 116 of each terminal 32 is also wedge shaped, as is perhaps best seen in FIG. 11, for engagement with the apertures 80 in the circuit board 28. It should be noted that the apertures 80 are formed into a plurality of rows 146 and 148 for engagement by terminals of the outer row 120 and of the inner row 122 of the plug 24, respectively.

For purposes of affording a more complete understanding of the invention, it is advantageous to provide a function description of the mode in which the component parts coöperate. The wires 40 will be connected to female type terminals 54 in the receptacle 22. The male type terminals 32 will be inserted into bores or apertures 102 in the plug 24 to position the forward end portion 66 of the terminals 32 for engagement by the terminals 54 in the receptacle 22. The rearward end portions 68 of the upper or outer row of terminals 120 will then be bent about the offsets 110 to position the sections 114 in engagement with the relatively long forwardly extending slots 34 in the flange section 38 of the receptacle. Next the terminals 32 in the second or inner row 122 will be bent at the offsets 112 to move the sections 114 into engagement with the slots 36 in the flange section 38 of the plug 24. The pointed tipped end portions 116 of the terminals 32 of both the outer row 120 and inner row 122 will project for the same distance outwardly from the plug 24 for engagement with apertures 80 in the circuit board 28. The plug 24 will then be mounted on the circuit board 28 by merely pressing the end portions 116 of the terminals 32 into the apertures 80. The wedge shaped end portions 116 of the terminals will securely grip the sides of the apertures 80 to hold the plug 24 on the circuit board 28. Finally, the connection between the printed circuitry 30 and the terminals 32 will be completed by soldering the end portions or points 116, as indicated at 84 in FIG. 9, to the printed circuitry 30.

The receptacle 22 is then moved into mating engagement with the plug 24 by inserting the forwardly extending end portion 44 of the receptacle into the socket 50 in the plug 24 to move the connector section 92 of the forward end portion 66 of the terminals 32 into mating engagement with the terminals 54 in the receptacle 22. When the receptacle is pressed into engagement with the plug a reactive force will be transmitted longitudinally to the circuit board 28, as indicated by the arrow 88 in FIG. 2. This reactive force will not bend the circuit board 28 about its relatively stiff transverse axis so that the printed circuitry 30 is not cracked or broken by a deformation of the circuit board 28 when the receptacle 22 is pressed into the plug 24.

It should be recognized that the forward end portion 66 of the male type terminals 32 can be interchanged with the female type terminals 54, so that the female type terminals are mounted in the plug 24 and the male type terminals are mounted in the receptacle 22. However, the end portion 68 having the outwardly spaced apart offsets 110 and 112 must be retained in association with the plug 24 and circuit board 28 to mount the plug on the circuit board. It should be understood that the member or element 22 described herein, for purposes of this specification and claims, as a receptacle is known in the electrical components industry as a "receptacle" due to the fact that the female type terminals are mounted therein. It will also be understood that the member 24, described herein for purposes of this specification and claims as a plug is also known in the electrical components industry as a "plug," due to the fact that the male type terminals 32 are mounted therein. Obviously, at least from a colloquial sense, the terminology of "plug" and "receptacle" could be reversed in view of the "plugging" of member 22 into member 24. Insofar as the attachment of member 24 to the printed circuit board is concerned, member 24 can be either a "plug" or a "receptacle."

Although particular structures for the receptacle 22 and plug 24 have been shown, it will be apparent to those skilled in the art that it is primarily the relationship between the rearward end portion 68 of the terminals 32 and the circuit board 28 which results in the highly advantageous mounting of the connector assembly 20 on the circuit board 28 with a minimum of effort and without danger of cracking or breaking the printed circuitry 30. Thus, it is contemplated that plug and receptacle structures other than the specific structure shown could be used with terminals having end portions similar to the end portion 68. Therefore, while particular embodiments of the invention have been shown, it should be understood, of course, that the invention is not limited thereto, since many modifications may be made.

What is claimed is:

1. An assembly comprising: a printed circuit board; printed circuitry mounted on said circuit board; a first group of terminals mounted on said circuit board in engagement with said printed circuitry; and a second group of terminals mounted in mating engagement with said first group of terminals to electrically interconnect said second group of terminals and said printed circuitry, each terminal of said first group of terminals having a first end portion which engages said second group of terminals and a second end portion which engages said circuit board, said first end portion having a longitudinal axis which extends substantially parallel to a longitudinal axis of said circuit board, said first group of terminals including a first row of terminals having their first end portions spaced a first distance from said circuit board and a second row of terminals having their first end portions spaced a second larger distance from said circuit board, the second end portions of said first row of terminals being in engagement with a first row of apertures formed in said circuit board, and the second end portions of said second row terminals being in engagement with a second row of apertures formed in said circuit board, and housing means engaging said first group of terminals and said circuit board to hold said first roup of terminals in said rows, said second end portions of said first group of terminals having a generally V-shape and being mounted in wedging engagement with both said housing means and said apertures in said circuit board.

2. An assembly as set forth in claim 1 wherein: said housing means includes a first group of slots which are wedgingly engaged by the second end portions of terminals positioned in the first row and a second group of slots which are longer than said first group of slots and are wedgingly engaged by the second end portions of terminals positioned in the second row.

3. An assembly as set forth in claim 2 wherein: said second end portions of said first group of terminals includes a first section having a relatively large V-shaped cross section positioned in wedging engagement with the slots in said housing means and a second section having a relatively small V-shaped cross section in wedging engagement with the apertures in said circuit board, said first section being in abutting engagement with said circuit board to position said first group of terminals relative to said circuit board.

4. An electrical connector element comprising: an insulating body having a forward and a rearward end, said insulating body including a rearwardly extending flange section having a first series of slots and a second series of slots which extend forwardly of said first series of slots; a first row of metallic terminals which are connected to said insulating body; and a second row of metallic terminals which are connected to said insulating body and which are positioned adjacent to said first row of metallic terminals, each terminal of said first and second rows of terminals including a forward end portion for engagement with terminals of another connector element and a rearwardly extending end portion for connection to electrical circuitry, said rearwardly extending end portion having a first offset, a second offset positioned outwardly of said first offset, a slot engaging portion positioned outwardly of said second offset and an electrical circuitry engaging portion positioned outwardly of said slot engaging portion, said first row of terminals being bent at said second offsets to locate the slot engaging portions of said first row of terminals in engagement with said first series of slots, said second row of terminals being bent at said first offsets to locate the slot engaging portions of said second row of terminals in engagement with said second series of slots, the electrical circuitry engaging portions of said first and second rows of terminals being located to extend outwardly from the flange section of said insulating body for substantially the same distance to facilitate connecting the connector element to electrical circuitry.

5. An electrical connector element as set forth in claim 4 wherein: said slot engaging portions of said terminals have a substantially V-shape for wedging engagement with the slots formed in the flange section of said insulating body.

6. An electrical connector as set forth in claim 4 wherein: said slot engaging portions and said electrical circuitry engaging portions of said first and second rows of terminals have a common longitudinal axis which extends perpendicularly to a longitudinal axis of the forward end portions of said first and second rows of terminals.

7. A method of connecting printed electrical circuitry to other electrical circuitry comprising the method steps of: connecting a plurality of rows of metallic terminals to an insulating body having a first series of slots and a second series of slots which are longer than said first series of slots; bending the terminals of a first row to engage end portions of the terminals of the first row with the the second series of slots and to position tip ends of the end portions of the terminals of the first row in an outwardly extending relationship relative to the insulating body; bending the terminals of a second row at a place outwardly of the bend in the first row to engage end portions of the terminals of the second row with the first series of slots and to position tip ends of the end portions of the terminals of the second row in an outwardly extending relationship relative to the insulating body; inserting the tip ends of said first and second rows of terminals in apertures formed in the printed circuitry to interconnect the terminals and the printed circuitry; and connecting the terminals to other electrical circuitry by moving a connector element transversely of the tip ends of said terminal and into engagement with an opposite end portion of the terminals.

8. An assembly comprising: a printed circuit board having printed circuitry mounted in engagement with a surface of said circuit board; a first insulating body mounted in engagement with said circuit board, said first insulating body having a forward end portion and a rearward end portion, said rearward end portion including a flange section extending rearwardly in a generally parallel relationship with said surface of said circuit board, said flange section including a first series of slots which extend forwardly from a rearmost end of said flange section for a first distance and a second series of slots interspersed with said first series of slots and extending forwardly from the rearmost end of said flange section a second distance which is larger than said first distance; a first row of metallic terminals connected to said first insulating body; a second row of metallic terminals connected to said first insulating body, said second rows of metallic terminals being located adjacent to said first row of metallic terminals; a second insulating body mounted adjacent to said circuit board and said first insulating body; and third and fourth rows of metallic terminals connected to said second insulating body and to electrical circuitry; said third row of terminals being positioned in engagement with forward end portions of the terminals of said first row of terminals and said fourth row of terminals being positioned in engagement with forward end portions of the terminals of said second row of terminals to electrically connect said first and second rows of terminals to the electrical circuitry, each terminal of said first and second rows of terminals including a rearwardly extending end portion having a first offset, a second offset positioned outwardly of said first offset, a slot engaging portion positioned outwardly of said second offset and a tip portion positioned outwardly of said slot engaging portion, said first row of terminals being bent at said first offset to locate longitudinal axes of the forward end portions of said first row of terminals in a substantially parallel relationship with said surface of said circuit board and to locate the slot engaging portions of said first row of terminals in engagement with the second series of slots in said flange section, said second row of terminals being bent at said second offsets to locate longitudinal axes of the forward end portions of said second row of terminals in a substantially parallel relationship with both said surface of said circuit board and the longitudinal axes of the forward end portions of said first row of terminals and to locate the slot engaging portions of said second row of terminals in engagement with the second series of slots in said flange section, said tip portions of said first and second rows of terminals extending outwardly from said flange section with longitudinal axes of the tip portions in a perpendicular relationship with said surface of said circuit board, said tip portions being located in engagement with the printed circuitry on said circuit board to electrically interconnect said printed circuitry and said first and second rows of terminals.

9. An assembly as set forth in claim 8 wherein: said forward end portion of said first insulating body includes a plurality of wall sections which are positioned relative to said circuit board to form a socket defined by said wall sections and said circuit board for receiving an end portion of said first insulating member to position said first insulating member relative to said second insulating member and said circuit board.

10. An assembly as set forth in claim 8 wherein: said slot engaging portions of said first and second rows of terminals have a substantially V-shape and are mounted in wedging engagement with said slots.

11. An assembly as set forth in claim 10 wherein: said tip portions of said first and second rows of terminals have a substantially V-shape and are mounted in wedging engagement with a plurality of apertures in said circuit board.

12. An electrical connector element comprising: an insulating body having a forward and a rearward end, said insulating body including a forward opening and a horizontal wall having a series of rearwardly edge-opening slots; a row of metallic terminals mounted in said insulating body; each terminal including a forward end portion extending into said forward opening for engagement with conductive means on an insulating body inserted in said forward opening and further including a rearwardly extending end portion for connection to electrical circuitry, said rearwardly extending end portion having a downwardly bent portion received in a respective slot and extending below said wall to facilitate connecting the connector element to electrical circuitry; said downwardly bent portion having a V-shaped cross section and forming a wedging engagement in a respective slot.

13. An electrical connector element as set forth in claim 12 wherein said downwardly bent portion is of lesser transverse dimension than said forward end portion.

References Cited

UNITED STATES PATENTS

| | | | |
|---|---|---|---|
| 3,178,673 | 4/1965 | Krehbiel | 339—217 |
| 3,230,493 | 1/1966 | Jensen et al. | 339—17 |
| 3,264,597 | 8/1966 | Gammel | 339—17 |
| 3,320,572 | 5/1967 | Schwartz | 339—64 X |

FOREIGN PATENTS

| | | |
|---|---|---|
| 1,105,490 | 4/1961 | Germany. |

MARVIN A. CHAMPION, Primary Examiner

P. A. CLIFFORD, Assistant Examiner

U.S. Cl. X.R.

339—176, 217, 221